United States Patent
Negri et al.

(10) Patent No.: US 11,281,112 B2
(45) Date of Patent: Mar. 22, 2022

(54) METHOD OF MEASURING MISREGISTRATION IN THE MANUFACTURE OF TOPOGRAPHIC SEMICONDUCTOR DEVICE WAFERS

(71) Applicant: KLA CORPORATION, Milpitas, CA (US)

(72) Inventors: Daria Negri, Nesher (IL); Amnon Manassen, Haifa (IL); Gilad Laredo, Nesher (IL)

(73) Assignee: KLA CORPORATION, Milpitas, CA (US)

( * ) Notice: Subject to any disclaimer, the term of this patent is extended or adjusted under 35 U.S.C. 154(b) by 0 days.

(21) Appl. No.: 16/647,092

(22) PCT Filed: Feb. 14, 2020

(86) PCT No.: PCT/US2020/018200
§ 371 (c)(1),
(2) Date: Mar. 13, 2020

(87) PCT Pub. No.: WO2020/168140
PCT Pub. Date: Aug. 20, 2020

(65) Prior Publication Data
US 2021/0200104 A1 Jul. 1, 2021

Related U.S. Application Data

(60) Provisional application No. 62/870,264, filed on Jul. 3, 2019, provisional application No. 62/864,323, filed
(Continued)

(51) Int. Cl.
*G03F 7/20* (2006.01)
*G06T 7/00* (2017.01)

(52) U.S. Cl.
CPC ...... *G03F 7/70633* (2013.01); *G03F 7/70641* (2013.01); *G03F 7/70683* (2013.01); *G06T 7/0004* (2013.01); *G06T 2207/30148* (2013.01)

(58) Field of Classification Search
CPC ............ G03F 7/70633; G03F 7/70641; G03F 7/70683
See application file for complete search history.

(56) References Cited

U.S. PATENT DOCUMENTS 6,479,904 B1 * 11/2002 Maejima ............. G03F 7/70633
257/797
6,992,764 B1  1/2006 Yang et al.
(Continued)

FOREIGN PATENT DOCUMENTS

KR   20140096331 A    8/2014
WO   2016187468 A1   11/2016
(Continued)

OTHER PUBLICATIONS

WIPO, ISR for PCT/US2020/018200, dated Jun. 12, 2020.

*Primary Examiner* — Steven Whitesell Gordon
(74) *Attorney, Agent, or Firm* — Hodgson Russ LLP (57) ABSTRACT

A method of measuring misregistration in the manufacture of semiconductor device wafers including providing a multilayered semiconductor device wafer including at least a first layer and a second layer including at least one misregistration measurement target including a first periodic structure formed together with the first layer having a first pitch and a second periodic structure formed together with the second layer having a second pitch, imaging the first layer and the second layer at a depth of focus and using light having at least one first wavelength that causes images of both the first layer and the second layer to appear in at least one plane within the depth of focus and quantifying offset in the at least one plane between the images of the first layer
(Continued)

and the second layer, thereby to calculate misregistration of the first layer and the second layer.

22 Claims, 3 Drawing Sheets

Related U.S. Application Data on Jun. 20, 2019, provisional application No. 62/805,737, filed on Feb. 14, 2019.

(56) References Cited

U.S. PATENT DOCUMENTS

| | | | |
|---|---|---|---|
| 7,009,704 B1 | 3/2006 | Nikoonahad et al. | |
| 2003/0044702 A1 | 3/2003 | Schulz | |
| 2006/0098199 A1* | 5/2006 | Nikoonahad | G01B 11/272 |
| | | | 356/399 |
| 2013/0314708 A1 | 11/2013 | Hsieh et al. | |
| 2016/0282730 A1* | 9/2016 | Sasaki | G01B 11/272 |
| 2017/0176328 A1* | 6/2017 | Jak | G01N 21/474 |
| 2018/0073866 A1* | 3/2018 | Tarabrin | G01B 11/272 |

FOREIGN PATENT DOCUMENTS

| | | |
|---|---|---|
| WO | 2018034908 A1 | 2/2018 |
| WO | 2018187108 A1 | 10/2018 |

* cited by examiner

METHOD OF MEASURING MISREGISTRATION IN THE MANUFACTURE OF TOPOGRAPHIC SEMICONDUCTOR DEVICE WAFERS

REFERENCE TO RELATED APPLICATIONS

Reference is hereby made to U.S. Provisional Patent Application Ser. No. 62/870,264, filed Jul. 3, 2019 and entitled METHOD OF MEASURING MISREGISTRATION IN THE MANUFACTURE OF TOPOGRAPHIC SEMICONDUCTOR DEVICE WAFERS, and U.S. Provisional Patent Application Ser. No. 62/805,737, filed Feb. 14, 2019 and entitled TARGET DESIGN FOR TOPOGRAPHIC OVERLAY TARGETS and U.S. Provisional Patent Application Ser. No. 62/864,323, filed Jun. 20, 2019 and entitled METHOD FOR MEASURING MISREGISTRATION IN THE MANUFACTURE OF TOPOGRAPHIC SEMICONDUCTOR DEVICE WAFERS, the disclosures of which are hereby incorporated by reference in their entirety and priority of which is hereby claimed.

Reference is also made to the following patents and patent applications, which are related to the subject matter of the present application, the disclosures of which are hereby incorporated by reference:

Applicant's PCT Patent Publication No. WO/2016/187468, entitled TOPOGRAPHIC PHASE CONTROL FOR OVERLAY MEASUREMENT and published Nov. 24, 2016;

Applicant's PCT Patent Publication No. WO/2018/034908, entitled SYSTEM AND METHOD FOR GENERATING MULTI-CHANNEL TUNABLE ILLUMINATION FROM A BROAD-BAND SOURCE and published Feb. 22, 2018; and Applicant's published PCT Patent Publication No. WO/2018/187108, entitled SYSTEMS AND METHODS FOR METROLOGY WITH LAYER-SPECIFIC ILLUMINATION SPECTRA and published Oct. 11, 2018.

FIELD OF THE INVENTION

The present invention relates measurement of misregistration in the manufacture of semiconductor devices generally.

BACKGROUND OF THE INVENTION

Various methods and systems are known for measurement of misregistration in the manufacture of semiconductor devices. In overlay measurement, the misregistration between a previous process layer and a current resist layer is measured. In many targets, such as with 3DNAND and DRAM, the vertical distance between these layers can be several microns.

A double grab was previously performed for overlay measurement. The first layer is imaged in its proper focus in the first grab and the second layer is imaged in its proper focus in the second grab. However, for a double grab to support total measurement uncertainty (TMU) requirements, the focusing mechanism needs to be fully telecentric and the XYZ stages should be noiseless and drift-less. These specifications may be difficult to meet, so specifications typically are relaxed.

In another previous example, the collection numerical aperture (NA) was reduced to increase depth of focus during overlay measurement. However, increasing depth of focus by reducing collection NA reduces a system's resolution and can require a larger pitch and target size increase. Additionally, lower light transmission through the optical system may occur, which reduces throughput.

Improved systems and methods of misregistration measurement are needed.

SUMMARY OF THE INVENTION

The present invention seeks to provide improved methods and systems for measurement of misregistration in the manufacture of semiconductor devices.

There is thus provided in accordance with an embodiment of the present invention a method of measuring misregistration in the manufacture of semiconductor device wafers including providing a multilayered semiconductor device wafer including at least a first layer and a second layer including at least one misregistration measurement target including a first periodic structure formed together with the first layer having a first pitch and a second periodic structure formed together with the second layer having a second pitch, imaging the first layer and the second layer at a depth of focus and using light having at least one first wavelength that causes images of both the first layer and the second layer to appear in at least one plane within the depth of focus and quantifying offset in the at least one plane between the images of the first layer and the second layer, thereby to calculate misregistration of the first layer and the second layer.

In accordance with an embodiment of the present invention, the first layer and the second layer are mutually separated by a perpendicular distance which is greater than the depth of focus.

In accordance with an embodiment of the present invention, the imaging includes a single grab.

In accordance with an embodiment of the present invention, the imaging of the first layer and the second layer is performed using light having at least two different wavelengths that causes images of both the first layer and the second layer to appear in at least one plane within the depth of focus.

In accordance with an embodiment of the present invention, the multilayered semiconductor device wafer includes at least a third layer and the at least one misregistration measurement target includes at least a third periodic structure on the at least third layer and the method also includes imaging the first layer and the third layer at a depth of focus and using light having at least one second wavelength that causes images of both the first layer and the third layer to appear in planes which are mutually separated by a perpendicular distance that is less than the depth of focus.

In accordance with an embodiment of the present invention, the depth of focus is approximately 50 nm for a numerical aperture of less than 0.3.

There is also provided in accordance with another embodiment of the present invention a method of measuring misregistration in the manufacture of semiconductor device wafers including providing a multilayered semiconductor device wafer including at least a first layer and a second layer including at least one misregistration measurement target including a first periodic structure formed together with the first layer having a first pitch and a second periodic structure formed together with the second layer having a second pitch, the at least first layer and second layer being mutually separated by a perpendicular distance of greater than 2 µm, imaging the first layer and the second layer at a depth of focus and using light having at least one first wavelength that causes images of both the first layer and the second layer to appear in at least one plane within the depth of focus and measuring offsets in the at least one plane between the images of the first layer and the second layer, thereby to calculate misregistration of the first layer and the second layer.

In accordance with an embodiment of the present invention, the imaging of the first layer is performed by a first imager and the imaging of the second layer is performed by a second imager.

In accordance with an embodiment of the present invention, the first imager and the second imager operate at different wavelengths.

In accordance with an embodiment of the present invention, the first imager and the second imager operate at identical wavelengths.

In accordance with an embodiment of the present invention, the imaging of the first layer and the imaging of the second layer are performed by a single imager.

In accordance with an embodiment of the present invention, the single imager images the first layer and the second layer with a light having a single wavelength.

Alternatively, in accordance with an embodiment of the present invention, the single imager images the first layer and the second layer with a light having at least two wavelengths.

In accordance with an embodiment of the present invention, the single imager images the first layer and the second layer in a single grab.

There is further provided in accordance with yet another embodiment of the present invention a system for measuring misregistration in the manufacture of semiconductor device wafers, the system including an imager, imaging at least a first layer and a second layer of a multilayered semiconductor device wafer including at least one misregistration measurement target including a first periodic structure formed together with the first layer having a first pitch and a second periodic structure formed together with the second layer having a second pitch, the imager operating at a depth of focus and using light having at least one first wavelength that causes images of both the first layer and the second layer to appear in at least one plane within the depth of focus and an offset quantifier, measuring offsets in the at least one plane between the images of the first layer and the second layer, thereby to calculate misregistration.

In accordance with an embodiment of the present invention, the first layer and the second layer are mutually separated by a perpendicular distance which is greater than the depth of focus.

In accordance with an embodiment of the present invention, the imaging includes a single grab.

In accordance with an embodiment of the present invention, the imager operates at a depth of focus and using light having at least two different wavelengths that causes images of both the first layer and the second layer to appear in at least one plane within the depth of focus.

In accordance with an embodiment of the present invention, the multilayered semiconductor device wafer includes at least a third layer and the at least one misregistration measurement target includes at least a third periodic structure on the at least third layer and the imager is also operative for imaging the first layer and the third layer at a depth of focus and using light having at least one second wavelength that causes images of both the first layer and the third layer to appear in planes which are mutually separated by a perpendicular distance that is less than the depth of focus.

In accordance with an embodiment of the present invention, the depth of focus is approximately 50 nm for a numerical aperture of less than 0.3.

There is further provided in accordance with yet another embodiment of the present invention a system for measuring misregistration in the manufacture of semiconductor device wafers having a multilayered semiconductor device wafer including at least a first layer and a second layer including at least one misregistration measurement target including a first periodic structure formed together with the first layer having a first pitch and a second periodic structure formed together with the second layer having a second pitch, the at least first layer and second layer being mutually separated by a perpendicular distance of greater than 2 µm, the system including at least one imager, imaging the first layer and the second layer at at least one depth of focus and using light having at least one first wavelength that causes images of both the first layer and the second layer to appear in at least one plane within the depth of focus and an offset quantifier, measuring offsets in the at least one plane between the images of the first layer and the second layer, thereby to calculate misregistration.

In accordance with an embodiment of the present invention, the at least one imager includes a first imager imaging the first layer using light having the at least one first wavelength and a second imager imaging the second layer using light having at least one second wavelength, causing images of both the first layer and the second layer to appear in the at least one plane within the depth of focus.

In accordance with an embodiment of the present invention, the first imager and the second imager operate at different wavelengths.

Alternatively, in accordance with another embodiment of the present invention, the first imager and the second imager operate at identical wavelengths.

BRIEF DESCRIPTION OF THE DRAWINGS

The present invention will be understood and appreciated more fully from the following detailed description, taken in conjunction with the drawings in which.

DETAILED DESCRIPTION

Figure 1:
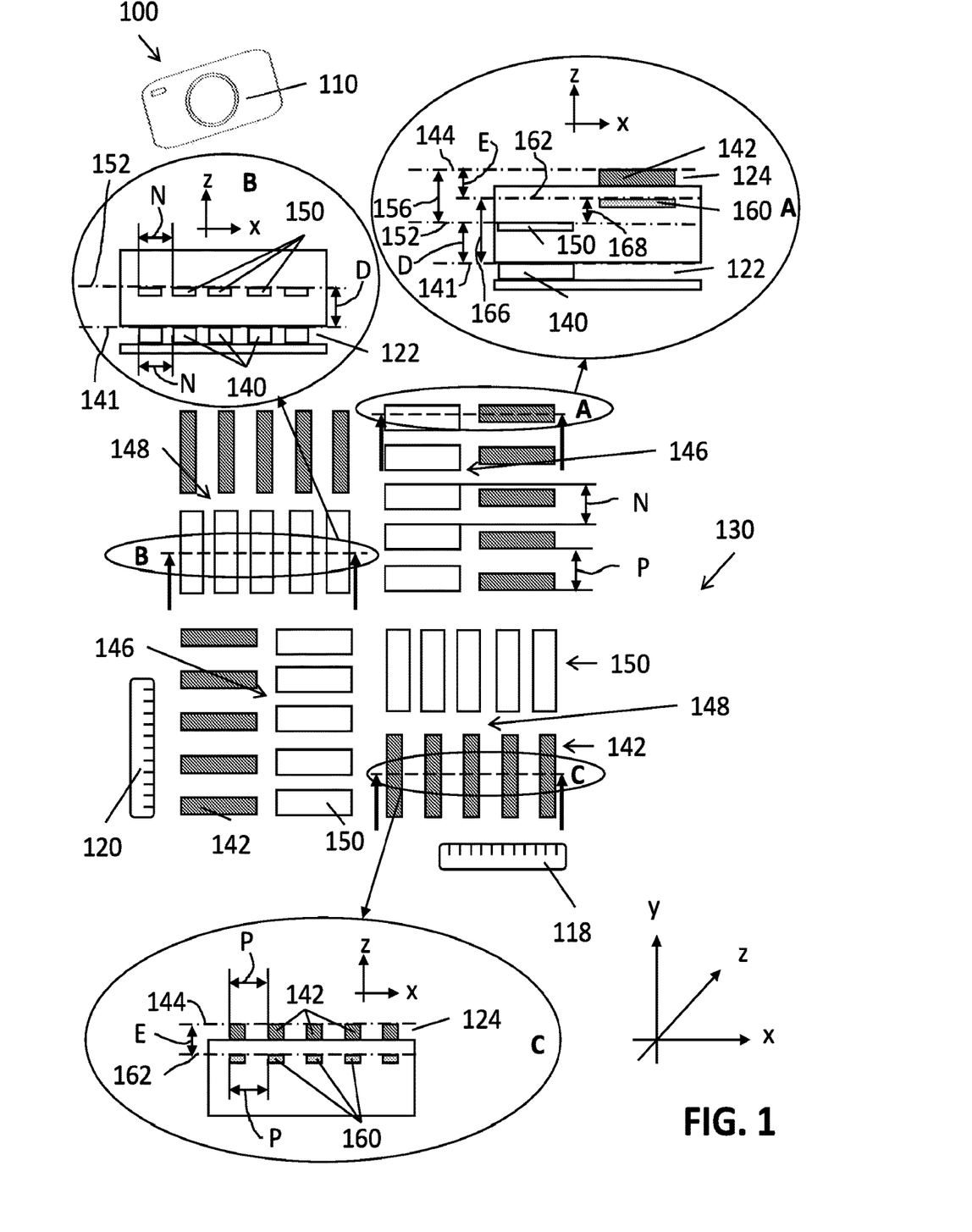
FIG. 1 is a simplified schematic illustration of an embodiment of a system for measuring misregistration in the manufacture of semiconductor device wafers.
Figure 2:
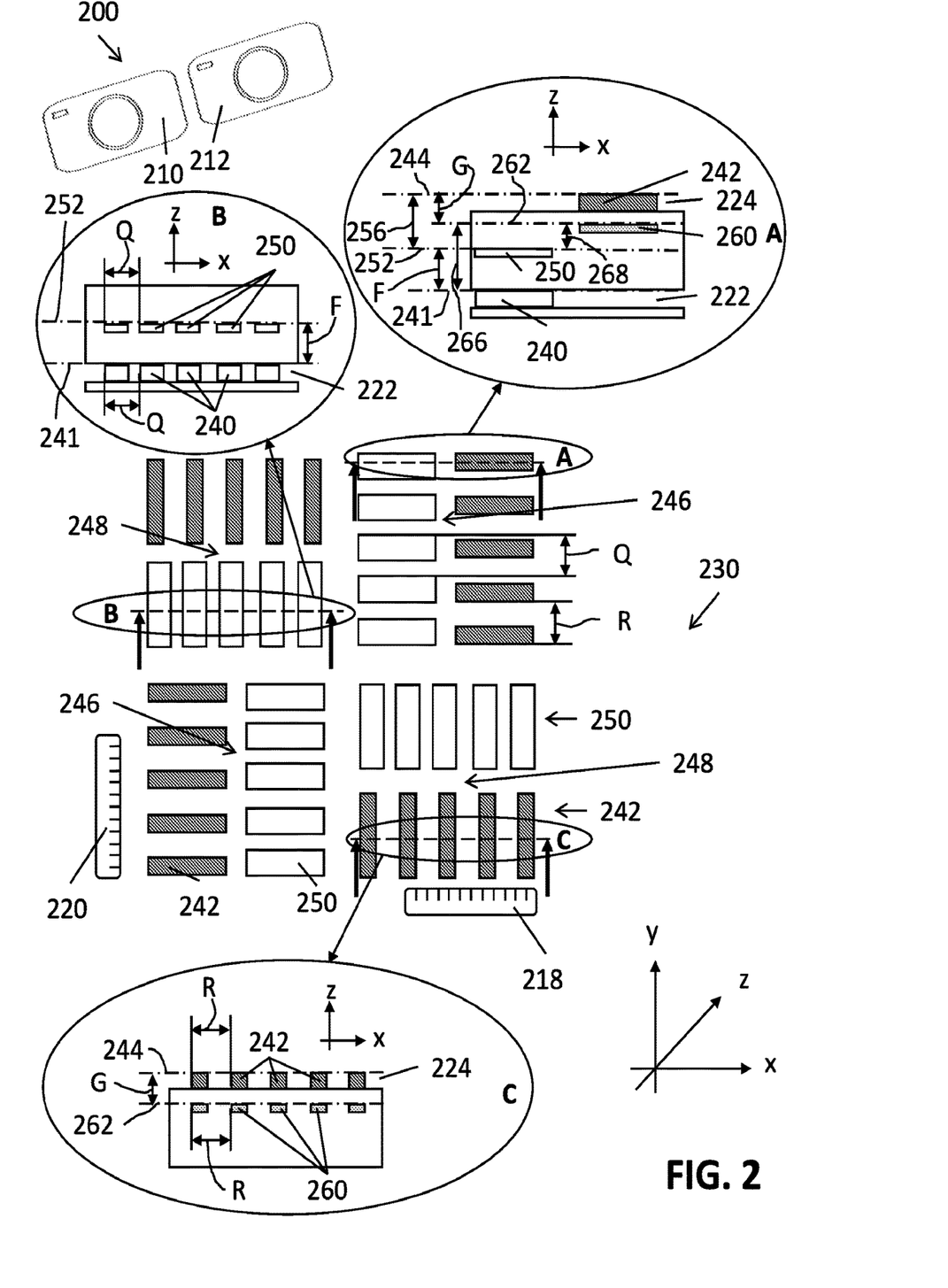
FIG. 2 is a simplified schematic illustration of an additional embodiment of a system for measuring misregistration in the manufacture of semiconductor device wafers.

Reference is now made to FIGS. 1 and 2, which are simplified schematic illustrations of embodiments of a system for measuring misregistration in the manufacture of semiconductor device wafers, FIG. 1 includes illustrations in three different dimensions, indicated by x-, y- and z-axes, the three dimensions being referred to hereinafter as an x-y plane, an x-z plane and a y-z plane, respectively. It is noted that FIG. 1 generally illustrates the x-y plane, while enlargements A, B and C of FIG. 1 illustrate planes parallel to the x-z plane.

As seen in FIG. 1, in a first embodiment, system 100 includes an imager 110, a first offset quantifier 118 to quantify offset in the x-direction, and a second offset quantifier 120 to quantify offset in the y-direction. The imager 110, offset quantifier 118, and offset quantifier 120 can be the imager and offset quantifiers included in a misregistration metrology tool, such as the one described in PCT Publication Nos. WO/2016/187468, WO/2018/034908 and WO/2018/187108, the disclosures of which are hereby incorporated by reference. It is noted that imager 110 has a low-illumination numerical aperture, such as below 0.3 or below 0.2. It is appreciated that, while in the illustrated embodiment shown in FIG. 1, first offset quantifier 118 and second offset quantifier 120 are shown as hardware components, they can be implemented as software components.

In an instance, the imager 110 is part of a metrology device. The imager 110 can include an illumination source to generate an illumination beam. The illumination beam may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source may further generate an illumination beam including any range of selected wavelengths. In another embodiment, the illumination source may include a spectrally-tunable illumination source to generate an illumination beam having a tunable spectrum.

The imager 110 also may include or be coupled with an illumination pathway, such as an illumination pathway with one or more lenses or additional optical components suitable for modifying and/or conditioning the illumination beam. For example, the one or more optical components may include, but are not limited to, one or more polarizers, one or more filters, one or more beam splitters, one or more diffusers, one or more homogenizers, one or more apodizers, or one or more beam shapers. By way of another example, the one or more optical components may include aperture stops to control the angle of illumination on the sample and/or field stops to control the spatial extent of illumination on the sample. The multilayered semiconductor device wafer can be disposed on a sample stage. The sample stage may include any device suitable for positioning the multilayered semiconductor device wafer. For example, the sample stage may include any combination of linear translation stages, rotational stages, tip/tilt stages or the like.

In another embodiment, the imager 110 includes or is coupled with a detector configured to capture radiation emanating from the multilayered semiconductor device wafer through a collection pathway. For example, the collection pathway may include, but not limited to, a collection lens (e.g., an objective lens) or one or more additional collection pathway lenses. The collection pathway may further include any number of optical elements to direct and/or modify illumination collected by the objective lens including, but not limited to, one or more collection pathway lenses, one or more filters, one or more polarizers, or one or more beam blocks. Additionally, the collection pathway may include field stops to control the spatial extent of the sample imaged onto the detector or aperture stops to control the angular extent of illumination from the sample used to generate an image on the detector. By way of another example, a detector may receive radiation reflected or scattered (e.g., via specular reflection, diffuse reflection, and the like) from the multilayered semiconductor device wafer. By way of another example, a detector may receive radiation generated by the multilayered semiconductor device wafer (e.g., luminescence associated with absorption of the illumination beam, or the like).

The detector may include any type of optical detector known in the art suitable for measuring illumination received from the multilayered semiconductor device wafer. For example, a detector may include, but is not limited to, a CCD detector, a TDI detector, a photomultiplier tube (PMT), an avalanche photodiode (APD), or the like. In another embodiment, a detector may include a spectroscopic detector suitable for identifying wavelengths of radiation emanating from the sample. In another embodiment, the imager 110 may include multiple detectors (e.g. associated with multiple beam paths generated by one or more beamsplitters to facilitate multiple metrology measurements by the imager 110.

Imager 110 is operative to image at least a first layer 122 and a second layer 124 of a multilayered semiconductor device wafer including at least one misregistration measurement target 130.

In an embodiment of the present invention, first layer 122 and second layer 124 are mutually separated by a distance in the z-direction which is greater than the depth of focus of imager 110, the distance being between 0 μm-30 μm in an example. It is noted that the distance in the z-direction separating first layer 122 and second layer 124 is a perpendicular distance. The perpendicular distance may be greater than 2 μm. The material between first layer 122 and second layer 124 has an index of refraction n and is at least partially transparent to photons. It is appreciated that as used herein, depth of focus refers to a set of focal planes within the optical depth of focus of imager 110, which give adequate misregistration results.

Enlargements A, B and C of FIG. 1 show sectional enlargements of target 130 in planes parallel to the x-z plane. It is noted that other features of the semiconductor device wafer on which target 130 is formed are not shown.

As seen particularly in enlargement B of FIG. 1, misregistration measurement target 130 includes a first periodic structure 140 formed together with first layer 122 and characterized by a first pitch N and lying in a plane 141. Misregistration measurement target 130 further includes a second periodic structure 142 formed together with second layer 124 and characterized by a second pitch P and lying in a plane 144. It is appreciated that for the sake of clarity, in FIG. 1, planes 141 and 144 are shown at the top surfaces of first and second layers 122 and 124, respectively; however, planes 141 and 144 may be any planes lying within layers 122 and 124, respectively, that are parallel to the top surfaces of first and second layers 122 and 124, respectively.

It is noted that target 130 can include two periodic structure sets 146 and two periodic structure sets 148, each of periodic structure sets 146 and 148 including both periodic structures 140 and 142. Periodic structure sets 146 and 148 appear in target 130 in different mutually orthogonal orientations, giving target 130 rotational symmetry. It is appreciated that other than with respect to their orientation, each of periodic structure sets 146 and 148 can be identical to each other.

Imager 110 operates at a depth of focus and uses light having at least one wavelength $\lambda_1$ that causes at least one Talbot image 150 of first periodic structure 140 to appear directly overlying first periodic structure 140 in a plane 152, as seen particularly in enlargement B of FIG. 1. It is appreciated that since plane 152 is parallel to the x-y plane and Talbot image 150 directly overlies first periodic structure 140 in plane 152, first periodic structure 140 is not visible in the central area of FIG. 1, which shows a top view of target 130 taken parallel to the x-y plane.

In an embodiment of the present invention, plane 152 containing Talbot image 150 appears at a distance D in the z-direction from plane 141 due to the Talbot effect. It is noted that distance D in the i-direction separating plane 141 and plane 152 is a perpendicular distance. It is appreciated that although in enlargements A and B of FIG. 1, Talbot image 150 is shown as having a thickness, Talbot image 150 has no thickness in the z direction. It is further appreciated that since Talbot image 150 appears directly overlying first periodic structure 140, the offset between second periodic structure 142 and first periodic structure 140 when imaged in one or more x-y planes is identical to the offset between second periodic structure 142 and Talbot image 150 when imaged in one or more x-y planes.

Perpendicular distance D, between plane 141 of first periodic structure 140 and plane 152 of Talbot image 150, is determined by wavelength $\lambda_1$ of light used by imager 110, as well as by pitch N of first periodic structure 140 and by index of refraction n of the material between first layer 122 and second layer 124. The relationship between perpendicular distance D, wavelength $\lambda_1$, pitch N and index of refraction n is defined in equation 1:

$$D = \frac{n}{2} \times \frac{\lambda_1}{1 - \sqrt{1 - \left(\frac{\lambda_1}{N}\right)^2}} \quad (\text{Eq. 1})$$

In an embodiment of the present invention, pitch N and wavelength $\lambda_1$ are chosen such that planes 152 and 144 are mutually separated by a perpendicular distance 156 in the z-direction that is less than the depth of focus of imager 110. Thus, system 100 is operative to image both Talbot image 150 and second periodic structure 142 in a single grab. It is appreciated that as used herein, imaging in a single grab refers to imaging without the imager changing its focus. In an embodiment of the present invention, features on the semiconductor device wafer that lie between first and second periodic structures 140 and 142 are formed to provide minimal interference with the visibility of Talbot image 150. In one embodiment of the present invention, imager 110 images target 130 using more than one wavelength of light, but without changing the focal plane in which the images are taken.

For example, if first layer 122 and second layer 124 are mutually separated by a perpendicular distance of 5.11 µm and index of refraction n of the material between first layer 122 and second layer 124 is 1.46, pitch N of first periodic structure 140 is chosen to be 1.2 µm and imager 110 images target 130 with light having at least one wavelength of 400 nm so that plane 152 appears at the same x-y plane as plane 144. Thus, Talbot image 150 and second periodic structure 142 are imaged in the same x-y plane in a single grab.

As another example, if first layer 122 and second layer 124 are mutually separated by a perpendicular distance of 17.84 µm and index of refraction n of the material between first layer 122 and second layer 124 is 2.0, pitch N of first periodic structure 140 is chosen to be 2.7 µm and imager 110 images target 130 with light having at least one wavelength of 800 nm so that plane 152 appears in an x-y plane 0.02 µm below plane 144. Thus, Talbot image 150 and second periodic structure 142 are present within the same depth of focus of imager 110 and are imaged in a single grab.

Offset quantifiers 118 and 120 are respectively operative to measure offset in the x-direction and y-direction between images of Talbot image 150 and second periodic structure 142, thereby calculating misregistration between first layer 122 and second layer 124.

Alternatively, imager 110 may operate at a depth of focus and using light having at least one wavelength $\lambda_2$ that causes at least one Talbot image 160 of second periodic structure 142 to appear directly underlying second periodic structure 142 in a plane 162, as seen particularly in enlargement C of FIG. 1. It is appreciated that since plane 162 is parallel to the x-y plane and Talbot image 160 directly underlies second periodic structure 142 in plane 162, Talbot image 160 is not visible in the central area of FIG. 1, which shows a top view of target 130 taken parallel to the x-y plane.

In an embodiment of the present invention, plane 162 containing Talbot image 160 appears at a distance E in the z-direction from plane 144 due to the Talbot effect. It is noted that distance E in the z-direction separating plane 144 and plane 162 is a perpendicular distance. It is appreciated that although in enlargements A and C of FIG. 1, Talbot image 160 is shown as having a thickness, Talbot image 160 has no thickness in the z direction. It is further appreciated that since Talbot image 160 appears directly underlying second periodic structure 142, the offset between first periodic structure 140 and second periodic structure 142 when imaged in one or more x-y planes is identical to the offset between first periodic structure 140 and Talbot image 160 when imaged in one or more x-y planes.

Perpendicular distance E is determined by wavelength $\lambda_2$ of light used by imager 110, as well as by pitch P of second periodic structure 142 and by index of refraction n of the material between first layer 122 and second layer 124. The relationship between perpendicular distance E, wavelength $\lambda_2$, pitch P and index of refraction n is defined in equation 2:

$$E = \frac{n}{2} \times \frac{\lambda_2}{1 - \sqrt{1 - \left(\frac{\lambda_2}{P}\right)^2}} \quad (\text{Eq. 2})$$

In an embodiment of the present invention, pitch P and wavelength $\lambda_2$ are chosen such that planes 162 and 141 are mutually separated by a perpendicular distance 166 in the z-direction that is less than the depth of focus of imager 110. Thus, system 100 is operative to image both Talbot image 160 and first periodic structure 140 in a single grab. In an embodiment of the present invention, features on the semiconductor device wafer that lie between first and second periodic structures 140 and 142 are formed to provide minimal interference with the visibility of Talbot image 160. In one embodiment of the present invention, imager 110 images target 130 using more than one wavelength of light, but without changing the focal plane in which the images are taken.

For example, if first layer 122 and second layer 124 are mutually separated by a perpendicular distance of 5.11 µm and index of refraction n of the material between first layer 122 and second layer 124 is 1.46, pitch P of second periodic structure 142 is chosen to be 1.2 µm and imager 110 images target 130 with light having at least one wavelength of 400 nm so that plane 162 appears at the same x-y plane as plane 141. Thus, Talbot image 160 and first periodic structure 140 are imaged in the same x-y plane in a single grab.

As another example, if first layer 122 and second layer 124 are mutually separated by a perpendicular distance of 17.84 µm and index of refraction n of the material between first layer 122 and second layer 124 is 2.0, pitch P of second periodic structure 142 is chosen to be 2.7 µm and imager 110 images target 130 with light having at least one wavelength of 800 nm so that plane 162 appears in an x-y plane 0.02 µm above plane 144. Thus, Talbot image 160 and first periodic structure 140 are present within the same depth of focus of imager 110 and are imaged in a single grab.

Offset quantifiers 118 and 120 are respectively operative to measure offset in the x-direction and y-direction between images of Talbot image 160 and first periodic structure 140, thereby calculating misregistration between first layer 122 and second layer 124.

In an additional embodiment of the present invention, pitch N and pitch P are chosen such that when imager 110 operates at a depth of focus and uses at least one wavelength $\lambda_3$, Talbot images 150 and 160 appear in planes 152 and 162, respectively, which are respective perpendicular distances D and E from first and second layers 122 and 124, respectively. In such a case, perpendicular distances D and E are chosen such that planes 152 and 162 are mutually separated by a perpendicular distance 168 in the z-direction that is less than the depth of focus of imager 110. Thus, system 100 is operative to image both Talbot image 150 and Talbot image 160 in a single grab.

The relationship between perpendicular distance D, wavelength $\lambda_3$, pitch N and index of refraction n is defined in equation 3:

$$D = \frac{n}{2} \times \frac{\lambda_3}{1 - \sqrt{1 - \left(\frac{\lambda_3}{N}\right)^2}} \quad \text{(Eq. 3)}$$

The relationship between perpendicular distance E, wavelength $\lambda_3$, pitch P and index of refraction n is defined in equation 4:

$$E = \frac{n}{2} \times \frac{\lambda_3}{1 - \sqrt{1 - \left(\frac{\lambda_3}{P}\right)^2}} \quad \text{(Eq. 4)}$$

In an embodiment of the present invention, features on the semiconductor device wafer that lie between first and second periodic structures 140 and 142 are formed to provide minimal interference with the visibility of Talbot images 150 and 160. In one embodiment of the present invention, imager 110 images target 130 using more than one wavelength of light, but without changing the focal plane in which the images are taken.

For example, if first layer 122 and second layer 124 are mutually separated by a perpendicular distance of 27.78 µm and index of refraction n of the material between first layer 122 and second layer 124 is 1.46, pitch N of first periodic structure 140 is chosen to be 2.5 µm, pitch P of second periodic structure 142 is chosen to be 1.2 µm, and imager 110 images target 130 with light having a wavelength of 400 nm. Thus, plane 152 appears at a distance D of 10.6 µm above first layer 122 and plane 162 appears at a distance E of 2.4 µm below second layer 124. Thus, first Talbot image 150 and second Talbot image 160 are separated by 0.01 µm, which is within the depth of focus of imager 110, and thus Talbot image 150 and Talbot image 160 are imaged in a single grab.

As an additional example, if first layer 122 and second layer 124 are mutually separated by a perpendicular distance of 32.21 m and index of refraction n of the material between first layer 122 and second layer 124 is 2.0, pitch N of first periodic structure 140 is chosen to be 2.1 µm, pitch P of second periodic structure 142 is chosen to be 2.7 µm, and imager 110 images target 130 both with light having a wavelength of 600 nm and with light having a wavelength of 800 nm. When imaged with light having a wavelength of 600 nm, plane 152 appears at a distance D of 3.5 µm above first layer 122, and when imaged with light having a wavelength of 800 nm, plane 162 appears at a distance E of 4.5 µm below second layer 124. Thus, first Talbot image 150 and second Talbot image 160 are imaged in the same x-y plane in a single grab.

Offset quantifiers 118 and 120 are respectively operative to measure offset in the x-direction and y-direction between images of Talbot image 150 and of Talbot image 160, thereby calculating misregistration between first layer 122 and second layer 124.

The offset quantifiers 118 and 120 can be software components run on one or more processors configured to execute program instructions maintained on a memory medium. In this regard, the one or more processors may execute any of the various process steps described throughout the present disclosure. Further, the processors may be configured to receive data including, but not limited to, metrology data (e.g., alignment measurement results, images of the target, pupil images, and the like) or metrology metrics (e.g., precision, tool-induced shift, sensitivity, diffraction efficiency, and the like). For example, the processors can receive data from the imager 110. The one or more processors may include any processing element known in the art. In this sense, the one or more processors may include any microprocessor-type device configured to execute algorithms and/or instructions. In one embodiment, the one or more processors may be part of a desktop computer, mainframe computer system, workstation, image computer, parallel processor, or any other computer system (e.g., networked computer) configured to execute a program configured to operate imager 110. It is further recognized that the term "processor" may be broadly defined to encompass any device having one or more processing elements, which execute program instructions from a non-transitory memory medium.

It is appreciated that system 100 as described herein with reference to FIG. 1 may also include a target having three or more layers. In a case wherein system 100 includes a target having three or more layers, each layer of the target includes one periodic structure formed together with a corresponding layer of the semiconductor device wafer whose misregistration is to be measured. It is noted that such a target can include two periodic structure sets, each periodic structure set including all periodic structures in the target. Each of the two periodic structure sets may appear in the target in different mutually orthogonal orientations, giving the target rotational symmetry. It is appreciated that other than with respect to their orientation, each of the periodic structure sets can be identical to each other. It is appreciated that the misregistration of any two layers of such a multilayered semiconductor device wafer can be measured by system 100 by comparing the misregistration of the periodic structures on those two layers, as described herein.

Turning now to FIG. 2, it is seen that FIG. 2 includes illustrations in three different dimensions, indicated by x-, y- and z-axes, the three dimensions being referred to hereinafter as an x-y plane, an x-z plane and a y-z plane, respectively. It is noted that FIG. 2 generally illustrates the x-y plane, while enlargements A, B and C of FIG. 2 illustrate planes parallel to the x-z plane.

As seen in FIG. 2, in a first embodiment, system 200 includes a first imager 210, a second imager 212, a first offset quantifier 218 to quantify offset in the x-direction, and a second offset quantifier 220 to quantify offset in the y-direction. A typical first imager 210, second imager 212, offset quantifier 218 and offset quantifier 220 are the imagers and offset quantifiers included in a misregistration metrology tool, such as the one described in PCT Publication Nos. WO/2016/187468, WO/2018/034908 and WO/2018/187108, the disclosures of which are hereby incorporated by reference. It is noted that first imager 210 and second imager 212 both have a low-illumination numerical aperture, such as below 0.3 or below 0.2. It is appreciated that, while in the illustrated embodiment shown in FIG. 2, first offset quantifier 218 and second offset quantifier 220 are shown as hardware components, they can be implemented as software components. The first imager 210 and second imager 212 may be similar to the imager 110. The first offset quantifier 218 and second offset quantifier 220 may be similar to the first offset quantifier 118 and second offset quantifier 120.

First imager 210 is operative to image at least a first layer 222 of a multilayered semiconductor device wafer including at least one misregistration measurement target 230. Second imager 212 is operative to image at least a second layer 224 of a multilayered semiconductor device wafer including at least misregistration measurement target 230.

In an embodiment of the present invention, first layer 222 and second layer 224 are mutually separated by a distance in the z-direction which is too large to allow both first layer 222 and second layer 224 to lie within the depths of focus of first imager 210 and second imager 212, respectively, the distance can be between 0 μm-60 μm in an example. It is noted that the distance in the z-direction separating first layer 222 and second layer 224 is a perpendicular distance. The perpendicular distance may be greater than 2 μm. The material between first layer 222 and second layer 224 has an index of refraction n and is at least partially transparent to photons. It is appreciated that as used herein, depth of focus refers to a set of focal planes within the optical depth of focus of first and second imagers 210 and 212, respectively, which give adequate misregistration results.

Enlargements A, B and C of FIG. 2 show sectional enlargements of target 230 in planes parallel to the x-z plane. It is noted that other features of the semiconductor device wafer on which target 230 is formed are not shown.

As seen particularly in enlargement B of FIG. 2, misregistration measurement target 230 includes a first periodic structure 240 formed together with first layer 222 and characterized by a first pitch Q and lying in a plane 241. Misregistration measurement target 230 further includes a second periodic structure 242 formed together with second layer 224 and characterized by a second pitch R and lying in a plane 244. It is appreciated that for the sake of clarity, in FIG. 2, planes 241 and 244 are shown at the top surfaces of first and second layers 222 and 224, respectively however, planes 241 and 244 may be any planes lying within layers 222 and 224, respectively, that are parallel to the top surfaces of first and second layers 222 and 224, respectively.

It is noted that target 230 can include two periodic structure sets 246 and two periodic structure sets 248, each of periodic structure sets 246 and 248 including both periodic structures 240 and 242. Periodic structure sets 246 and 248 appear in target 230 in different mutually orthogonal orientations, giving target 230 rotational symmetry. It is appreciated that other than with respect to their orientation, each of periodic structure sets 246 and 248 may be identical to each other.

First imager 210 operates at a depth of focus and uses light having at least one wavelength $\lambda_4$ that causes at least one Talbot image 250 of first periodic structure 240 to appear directly overlying first periodic structure 240 in a plane 252. It is appreciated that since plane 252 is parallel to the x-y plane and Talbot image 250 directly overlies first periodic structure 240 in a plane 252, first periodic structure 240 is not visible in the central area of FIG. 2, which shows a top view of target 230 taken parallel to the x-y plane.

In an embodiment of the present invention, plane 252 containing Talbot image 250 appears at a distance F in the z-direction from plane 241 due to the Talbot effect. It is noted that distance F in the z-direction separating plane 241 and plane 252 is a perpendicular distance. It is appreciated that although in enlargements A and B of FIG. 2, Talbot image 250 is shown as having a thickness, Talbot image 250 has no thickness in the z direction. It is further appreciated that since Talbot image 250 appears directly overlying first periodic structure 240, the offset between second periodic structure 242 and first periodic structure 240 when imaged in one or more x-y planes is identical to the offset between second periodic structure 242 and Talbot image 250 when imaged in one or more x-y planes.

Perpendicular distance F, between plane 241 of first periodic structure 240 and plane 252 of Talbot image 250, is determined by wavelength $\lambda_4$ of light used by first imager 210, as well as by pitch Q of first periodic structure 240 and by index of refraction n of the material between first layer 222 and second layer 224. The relationship between perpendicular distance F, wavelength $\lambda_4$, pitch Q and index of refraction n is defined in equation 5:

$$F = \frac{n}{2} \times \frac{\lambda_4}{1 - \sqrt{1 - \left(\frac{\lambda_4}{Q}\right)^2}} \qquad \text{(Eq. 5)}$$

In an embodiment of the present invention, pitch Q and wavelength $\lambda_4$ are chosen such that planes 252 and 244 are mutually separated by a perpendicular distance 256 in the z-direction that is small enough for planes 252 and 244 to both lie within the depths of focus of first and second imagers 210 and 212, respectively. Thus, system 200 is operative to image both Talbot image 250 and second periodic structure 242 in a single grab. In an embodiment of the present invention, features on the semiconductor device wafer that lie between first and second periodic structures 240 and 242 are formed to provide minimal interference with the visibility of Talbot image 250.

For example, if first layer 222 and second layer 224 are mutually separated by a perpendicular distance of 5.11 μm and index of refraction n of the material between first layer 222 and second layer 224 is 1.46, pitch Q of first periodic structure 240 is chosen to be 1.2 μm, first imager 210 images first layer 222 with light having at least one wavelength of 400 nm and second imager 212 images second layer 224 with light having any suitable wavelength so that plane 252 appears at the same x-y plane as plane 244. Thus, Talbot image 250 and second periodic structure 242 are imaged in the same x-y plane in a single grab by first imager 210 and second imager 212, respectively.

As another example, if first layer 222 and second layer 224 are mutually separated by a perpendicular distance of 18.82 μm and index of refraction n of the material between first layer 222 and second layer 224 is 2.0, pitch Q of first periodic structure 240 is chosen to be 2.7 μm, first imager 210 images first layer 222 with light having at least one wavelength of 800 nm and second imager 212 images second layer 224 with light having any suitable wavelength so that plane 252 appears in an x-y plane 1.0 μm below plane 244. Thus, Talbot image 250 and second periodic structure 242 are present within the respective depths of focus of first imager 210 and second imager 212, and are imaged in a single grab.

Offset quantifiers 218 and 220 are respectively operative to measure offset in the x-direction and y-direction between images of Talbot image 250 taken by first imager 210 and second periodic structure 242 taken by second imager 212, thereby calculating misregistration between first layer 222 and second layer 224.

Alternatively, second imager 212 may operate at a depth of focus and using light having at least one wavelength $\lambda_5$ that causes at least one Talbot image 260 of second periodic structure 242 to appear directly underlying second periodic structure 242 in a plane 262, as seen particularly in enlargement C of FIG. 2. It is appreciated that since plane 262 is parallel to the x-y plane and Talbot image 260 directly underlies second periodic structure 242 in plane 262, Talbot image 260 is not visible in the central area of FIG. 2, which shows a top view of target 230 taken parallel to the x-y plane.

In an embodiment of the present invention, plane 262 containing Talbot image 260 appears at a distance G in the z-direction from plane 244 due to the Talbot effect. It is noted that distance G in the z-direction separating plane 244 and plane 262 is a perpendicular distance. It is appreciated that although in enlargements A and C of FIG. 2, Talbot image 260 is shown as having a thickness, Talbot image 260 has no thickness in the z direction. It is further appreciated that since Talbot image 260 appears directly underlying second periodic structure 242, the offset between first periodic structure 240 and second periodic structure 242 when imaged in one or more x-y planes is identical to the offset between first periodic structure 240 and Talbot image 260 when imaged in one or more x-y planes.

Perpendicular distance G is determined by wavelength $\lambda_5$ of light used by 10 second imager 212, as well as by pitch R of second periodic structure 242 and by index of refraction n of the material between first layer 222 and second layer 224. The relationship between perpendicular distance E, wavelength $\lambda_2$, pitch R and index of refraction n is defined in equation 6:

$$G = \frac{n}{2} \times \frac{\lambda_5}{1 - \sqrt{1 - \left(\frac{\lambda_5}{R}\right)^2}} \quad \text{(Eq. 6)}$$

In an embodiment of the present invention, pitch R and wavelength $\lambda_5$ are chosen such that planes 262 and 241 are mutually separated by a perpendicular distance 266 in the z-direction that is small enough for planes 262 and 241 to both lie within the depths of focus of second and first imagers 212 and 210, respectively. Thus, system 200 is operative to image both Talbot image 260 and first periodic structure 240 in a single grab. In an embodiment of the present invention, features on the semiconductor device wafer that lie between first and second periodic structures 240 and 242 are formed to provide minimal interference with the visibility of Talbot image 260.

For example, if first layer 222 and second layer 224 are mutually separated by a perpendicular distance of 5.11 μm and index of refraction n of the material between first layer 222 and second layer 224 is 1.46, pitch R of second periodic structure 242 is chosen to be 1.2 μm, second imager 212 images second layer 224 with light having at least one wavelength of 400 nm and first imager 210 images first layer 222 with light having any suitable wavelength so that plane 262 appears at the same x-y plane as plane 241. Thus, Talbot image 260 and first periodic structure 240 are imaged in the same x-y plane in a single grab by second imager 212 and first imager 210, respectively.

As another example, if first layer 222 and second layer 224 are mutually separated by a perpendicular distance of 18.82 μm and index of refraction n of the material between first layer 222 and second layer 224 is 2.0, pitch R of second periodic structure 242 is chosen to be 2.7 μm, second imager 212 images second layer 224 with light having at least one wavelength of 800 nm and first imager 210 images first layer 222 with light having any suitable wavelength so that plane 262 appears in an x-y plane 1.0 μm above plane 241. Thus, Talbot image 260 and first periodic structure 240 are present within the respective depths of focus of second imager 212 and first imager 210, and are imaged in a single grab.

Offset quantifiers 218 and 220 are respectively operative to measure offset in the x-direction and y-direction between images of Talbot image 260 taken by second imager 212 and first periodic structure 240 taken by first imager 210, thereby calculating misregistration between first layer 222 and second layer 224.

In an additional embodiment of the present invention, pitch Q and pitch R are chosen such that when first imager 210 operates at a depth of focus and uses a wavelength $\lambda_4$ and second imager 212 operates at a depth of focus and uses a wavelength $\lambda_5$, Talbot images 250 and 260 appear in planes 252 and 262, respectively, which are respective perpendicular distances F and G from first and second layers 222 and 224, respectively. In such a case, perpendicular distances F and G are chosen such that planes 252 and 262 are mutually separated by a perpendicular distance 268 in the z-direction that is small enough for planes 252 and 262 to both lie within the depths of focus of first and second imagers 210 and 212, respectively. Thus, system 200 is operative to image both Talbot image 250 and Talbot image 260 in a single grab. In an embodiment of the present invention, features on the semiconductor device wafer that lie between first and second periodic structures 240 and 242 are formed to provide minimal interference with the visibility of Talbot images 250 and 260.

For example, if first layer 222 and second layer 224 are mutually separated by a perpendicular distance of 27.97 μm and index of refraction n of the material between first layer 222 and second layer 224 is 1.46, pitch Q of first periodic structure 240 is chosen to be 2.5 μm, pitch R of second periodic structure 242 is chosen to be 1.2 μm, first imager 210 images first layer 222 with light having a wavelength of 400 nm and second imager 212 images second layer 224 with light having a wavelength of 400 nm. Thus, plane 252 appears at a distance F of 10.6 μm above first layer 222 and plane 262 appears at a distance G of 2.4 μm below second layer 224. Thus, first Talbot image 250 and second Talbot image 260 are separated by 0.2 μm, and are thus present within the respective depths of focus of first imager 210 and second imager 212, and are imaged in a single grab.

As an additional example, if first layer 222 and second layer 224 are mutually separated by a perpendicular distance of 32.21 μm and index of refraction n of the material between first layer 222 and second layer 224 is 2.0, pitch Q of first periodic structure 240 is chosen to be 2.1 μm, pitch R of second periodic structure 242 is chosen to be 2.7 μm, first imager 210 images first layer 222 with light having a wavelength of 600 nm and second imager 212 images second layer 224 with light having a wavelength of 800 nm. Thus, plane 252 appears at a distance F of 3.5 μm above first layer 222, and plane 262 appears at a distance G of 4.5 μm below second layer 224. Thus, first Talbot image 250 and second Talbot image 260 are imaged in the same x-y plane, and thus Talbot image 250 and Talbot image 260 are imaged in a single grab by first imager 210 and second imager 212, respectively.

Offset quantifiers 218 and 220 are respectively operative to measure offset in the x-direction and y-direction between images of Talbot image 250 and of Talbot image 260, thereby calculating misregistration between first layer 222 and second layer 224.

It is appreciated that system 200 as described herein with reference to FIG. 2 may also include a target having three or more layers. In a case wherein system 200 includes a target having three or more layers, each layer of the target includes one periodic structure formed together with a corresponding layer of the semiconductor device wafer whose misregistration is to be measured. It is noted that such a target can include two periodic structure sets, each periodic structure set including all periodic structures in the target. Each of the two periodic structure sets can appear in the target in different mutually orthogonal orientations, giving the target rotational symmetry. It is appreciated that other than with respect to their orientation, each of the periodic structure sets may be identical to each other. It is appreciated that the misregistration of any two layers of such a multilayered semiconductor device wafer can be measured by system 200 by comparing the misregistration of the periodic structures on those two layers, as described herein.

Figure 3:
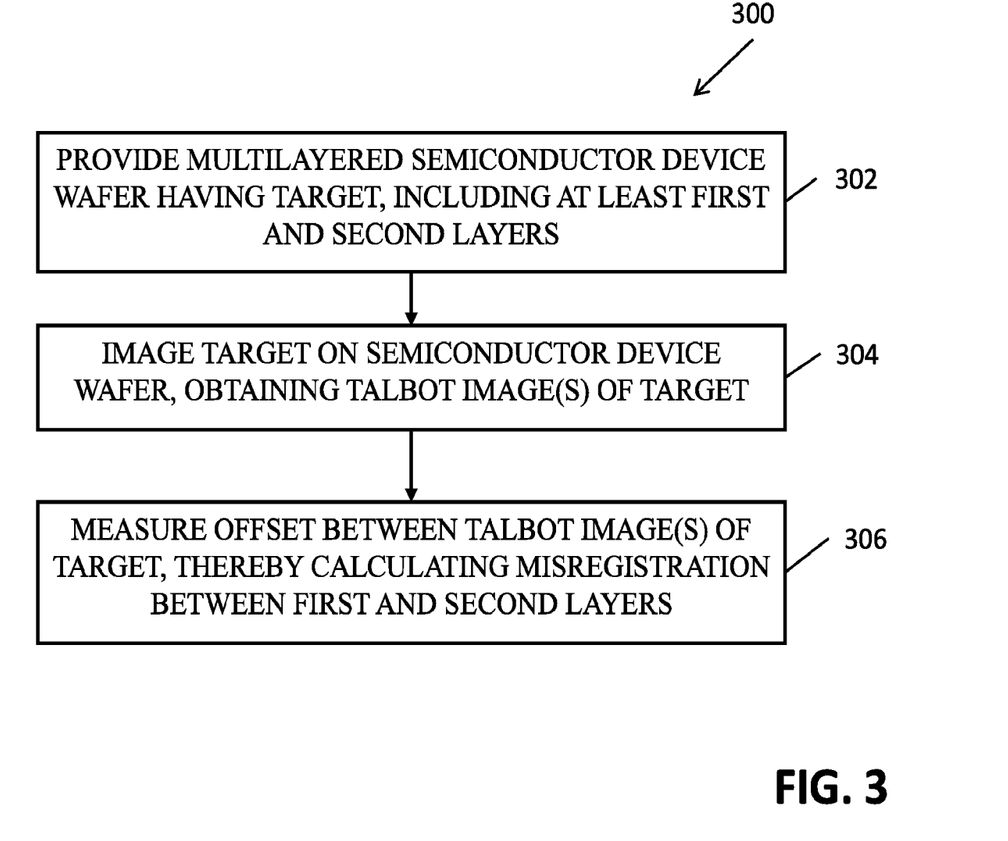
FIG. 3 is a simplified flowchart illustrating a method of measuring misregistration in the manufacture of semiconductor device wafers useful by the systems for measuring misregistration in the manufacture of semiconductor device wafers of FIG. 1 or FIG. 2.

Reference is now made to FIG. 3, which is a simplified flowchart illustrating a method 300 of measuring misregistration in the manufacture of semiconductor device wafers useful by the system 100 or 200 for measuring misregistration in the manufacture of semiconductor device wafers, as described herein with reference to FIGS. 1 and 2.

As seen at a first step 302, a multilayered semiconductor device wafer having at least one suitable target, such as target 130 or 230, including at least first and second layers, is provided. Similarly, a target having three or more layers, as described herein with reference to alternate embodiments of FIGS. 1 and 2, may be provided.

As seen at a next step 304, the target provided in step 302 is imaged. As described herein with reference to FIGS. 1 and 2, in one embodiment of the present invention, characteristics of the target and the light used to image the target are chosen such that at least one Talbot image appears in a plane suitable for measurement of images of both layers without changing the focus of the imager. In another embodiment of the present invention, characteristics of the target and the light used to image the target are chosen such that a Talbot image of at least one layer appears in a plane that is further from the other layer than the actual layer of which it is a Talbot image.

Following step 304, at a next step 306 offset is measured between the Talbot image of one layer and either an image or a Talbot image of the other layer, thereby calculating misregistration between the first layer and the second layer.

It will be appreciated by persons skilled in the art that the present invention is not limited to what has been particularly shown and described herein. The scope of the present invention includes both combinations and subcombinations of various features described herein as well as modifications thereof, all of which are not in the prior art.

The invention claimed is:

1. A method of measuring misregistration in the manufacture of semiconductor device wafers comprising:
providing a multilayered semiconductor device wafer comprising at least a first layer and a second layer comprising at least one misregistration measurement target comprising a first periodic structure formed together with said first layer having a first pitch and a second periodic structure formed together with said second layer having a second pitch;
imaging said first layer and said second layer using an imager at a depth of focus and using light having at least one first wavelength that causes images of both said first layer and said second layer to appear in at least one plane within said depth of focus, wherein said first layer and said second layer are mutually separated by a perpendicular distance which is greater than said depth of focus; and
quantifying offset in said at least one plane between said images of said first layer and said second layer using an offset quantifier, thereby to calculate misregistration of said first layer and said second layer.

2. The method of measuring misregistration in the manufacture of semiconductor device wafers according to claim 1, wherein said imaging comprises a single grab.

3. The method of measuring misregistration in the manufacture of semiconductor device wafers according to claim 2, wherein said imaging of said first layer and said second layer is performed using light having at least two different wavelengths that causes images of both said first layer and said second layer to appear in at least one plane within said depth of focus.

4. The method of measuring misregistration in the manufacture of semiconductor device wafers according to claim 1, wherein said multilayered semiconductor device wafer comprises at least a third layer and said at least one misregistration measurement target comprises at least a third periodic structure on said at least third layer and wherein said method further comprises:
imaging said first layer and said third layer at a second depth of focus and using light having at least one second wavelength that causes images of both said first layer and said third layer to appear in planes which are mutually separated by a perpendicular distance that is less than said second depth of focus.

5. The method of measuring misregistration in the manufacture of semiconductor device wafers according to claim 1, wherein said depth of focus is approximately 50 nm for a numerical aperture of less than 0.3.

6. A method of measuring misregistration in the manufacture of semiconductor device wafers comprising:
providing a multilayered semiconductor device wafer comprising at least a first layer and a second layer comprising at least one misregistration measurement target comprising a first periodic structure formed together with said first layer having a first pitch and a second periodic structure formed together with said second layer having a second pitch, said at least first layer and second layer being mutually separated by a perpendicular distance of greater than 2 μm;

imaging said first layer and said second layer using an imager at a depth of focus and using light having at least one first wavelength that causes images of both said first layer and said second layer to appear in at least one plane within said depth of focus, wherein said first layer and said second layer are mutually separated by a perpendicular distance which is greater than a depth of focus; and measuring offsets in said at least one plane between said images of said first layer and said second layer using an offset quantifier, thereby to calculate misregistration of said first layer and said second layer.

7. The method of measuring misregistration in the manufacture of semiconductor device wafers according to claim 6, wherein said imaging of said first layer is performed by a first imager and said imaging of said second layer is performed by a second imager.

8. The method of measuring misregistration in the manufacture of semiconductor device wafers according to claim 7, wherein said first imager and said second imager operate at different wavelengths.

9. The method of measuring misregistration in the manufacture of semiconductor device wafers according to claim 7, wherein said first imager and said second imager operate at identical wavelengths.

10. The method of measuring misregistration in the manufacture of semiconductor device wafers according to claim 6, wherein said imaging of said first layer and said imaging of said second layer are performed by a single imager.

11. The method of measuring misregistration in the manufacture of semiconductor device wafers according to claim 10, wherein said single imager images said first layer and said second layer with a light having a single wavelength.

12. The method of measuring misregistration in the manufacture of semiconductor device wafers according to claim 10, wherein said single imager images said first layer and said second layer with a light having at least two wavelengths.

13. The method of measuring misregistration in the manufacture of semiconductor device wafers according to claim 12, wherein said single imager images said first layer and said second layer in a single grab.

14. A system for measuring misregistration in the manufacture of semiconductor device wafers, the system comprising:
an imager configured to image at least a first layer and a second layer of a multilayered semiconductor device wafer comprising at least one misregistration measurement target comprising a first periodic structure formed together with said first layer having a first pitch and a second periodic structure formed together with said second layer having a second pitch, said imager operating at a depth of focus and using light having at least one first wavelength that causes images of both said first layer and said second layer to appear in at least one plane within said depth of focus, wherein said first layer and said second layer are mutually separated by a perpendicular distance which is greater than said depth of focus; and
an offset quantifier configured to measure offsets in said at least one plane between said images of said first layer and said second layer, thereby to calculate misregistration.

15. The system of measuring misregistration in the manufacture of semiconductor device wafers according to claim 14, wherein said imaging comprises a single grab.

16. The system of measuring misregistration in the manufacture of semiconductor device wafers according to claim 15, wherein said imager operates at said depth of focus and using light having at least two different wavelengths that causes images of both said first layer and said second layer to appear in at least one plane within said depth of focus.

17. The system for measuring misregistration in the manufacture of semiconductor device wafers according to claim 14, wherein said multilayered semiconductor device wafer comprises at least a third layer and said at least one misregistration measurement target comprises at least a third periodic structure on said at least third layer and wherein said imager is also operative for imaging said first layer and said third layer at a second depth of focus and using light having at least one second wavelength that causes images of both said first layer and said third layer to appear in planes which are mutually separated by a perpendicular distance that is less than said depth of focus.

18. The system for measuring misregistration in the manufacture of semiconductor device wafers according to claim 14, wherein said depth of focus is approximately 50 nm for a numerical aperture of less than 0.3.

19. A system for measuring misregistration in the manufacture of semiconductor device wafers having a multilayered semiconductor device wafer comprising at least a first layer and a second layer comprising at least one misregistration measurement target comprising a first periodic structure formed together with said first layer having a first pitch and a second periodic structure formed together with said second layer having a second pitch, said at least first layer and second layer being mutually separated by a perpendicular distance of greater than 2 µm, the system comprising;
at least one imager configured to image said first layer and said second layer at at least one depth of focus and using light having at least one first wavelength that causes images of both said first layer and said second layer to appear in at least one plane within said depth of focus, wherein said first layer and said second layer are mutually separated by a perpendicular distance which is greater than said depth of focus; and
an offset quantifier configured to measure offsets in said at least one plane between said images of said first layer and said second layer, thereby to calculate misregistration.

20. The system for measuring misregistration in the manufacture of semiconductor device wafers according to claim 19, wherein said at least one imager comprises a first imager imaging said first layer using light having said at least one first wavelength and a second imager imaging said second layer using light having at least one second wavelength, causing images of both said first layer and said second layer to appear in said at least one plane within said depth of focus.

21. The system for measuring misregistration in the manufacture of semiconductor device wafers according to claim 20, wherein said first imager and said second imager operate at different wavelengths.

22. The system for measuring misregistration in the manufacture of semiconductor device wafers according to claim 20, wherein said first imager and said second imager operate at identical wavelengths.

* * * * *